US012374862B2

(12) United States Patent
Branca

(10) Patent No.: US 12,374,862 B2
(45) Date of Patent: Jul. 29, 2025

(54) LOW SIDE DRIVER FOR LASER DIODE

(71) Applicant: STMicroelectronics (Grenoble 2) SAS, Grenoble (FR)

(72) Inventor: Xavier Branca, Sassenage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 792 days.

(21) Appl. No.: 17/571,035

(22) Filed: Jan. 7, 2022

(65) Prior Publication Data

US 2022/0239062 A1 Jul. 28, 2022

(30) Foreign Application Priority Data

Jan. 22, 2021 (FR) .................................... 2100622

(51) Int. Cl.
*H01S 5/042* (2006.01)
*H01S 3/10* (2006.01)
*G01S 7/484* (2006.01)
*G01S 7/4865* (2020.01)

(52) U.S. Cl.
CPC .............. *H01S 5/0428* (2013.01); *H01S 3/10* (2013.01); *G01S 7/484* (2013.01); *G01S 7/4865* (2013.01)

(58) Field of Classification Search
None
See application file for complete search history.

(56) References Cited

U.S. PATENT DOCUMENTS

| | | | | |
|---|---|---|---|---|
| 5,796,767 A * | 8/1998 | Aizawa | ................... | H01S 5/042 372/38.02 |
| 7,362,142 B2 * | 4/2008 | Ozasa | .............. | H03K 17/04123 327/66 |
| 7,369,591 B1 * | 5/2008 | Ziazadeh | ................ | H01S 5/042 372/38.1 |
| 9,532,427 B2 * | 12/2016 | Schiappelli | .......... | H05B 45/397 |
| 11,240,895 B2 * | 2/2022 | Qiu | ......... | H05B 45/20 |
| 11,581,693 B2 * | 2/2023 | Zhuo | .................. | H03K 17/6871 |
| 11,923,658 B1 * | 3/2024 | Lenius | ................... | H05B 47/00 |
| 2004/0195981 A1 * | 10/2004 | Mizuno | ................... | H01S 5/042 362/800 |
| 2018/0083419 A1 * | 3/2018 | Lee | ......................... | H01S 5/042 |
| 2021/0028592 A1 * | 1/2021 | Zhuo | ................ | H03K 17/04106 |
| 2021/0273404 A1 * | 9/2021 | Tabata | .................. | G01S 7/4814 |
| 2022/0069545 A1 * | 3/2022 | Venkataraman | ...... | H01S 5/0428 |
| 2022/0239062 A1 * | 7/2022 | Branca | ................ | H01S 5/06216 |
| 2023/0387657 A1 * | 11/2023 | Jones | .................. | H01S 5/06808 |

FOREIGN PATENT DOCUMENTS

WO 2020012880 A1 1/2020

* cited by examiner

*Primary Examiner* — Tod T Van Roy
(74) *Attorney, Agent, or Firm* — Slater Matsil, LLP

(57) ABSTRACT

In an embodiment, a low side driver integrated circuit for a laser diode includes a reference transistor, an output transistor having a gate coupled to a gate of the reference transistor, a first transistor having a gate for receiving a pulsed signal, a drain coupled to a drain of the output transistor and a source coupled to ground, a second transistor, for obtaining a source voltage of the output transistor equal to the source voltage of the reference transistor, a first servo-control circuit for applying a drain voltage of the output transistor to the drain of the reference transistor, and a second servo-control circuit for applying a static reference voltage to the source of the reference transistor.

20 Claims, 1 Drawing Sheet

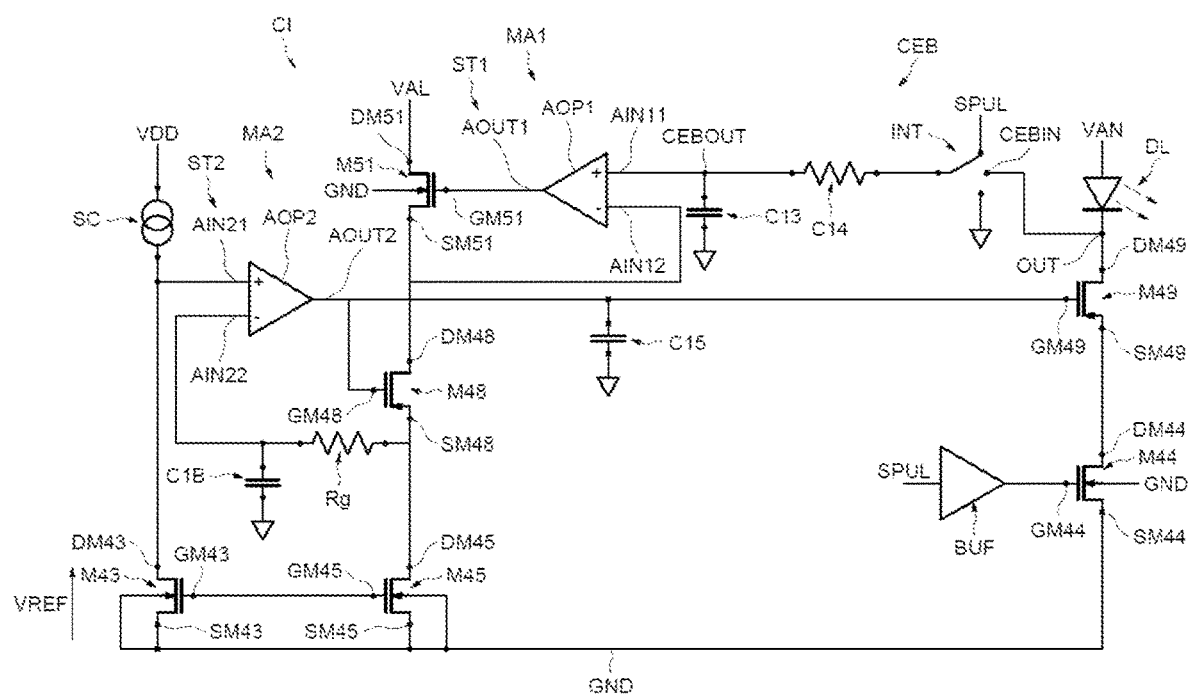

LOW SIDE DRIVER FOR LASER DIODE

CROSS-REFERENCE TO RELATED APPLICATIONS

This application claims the benefit of French patent application number FR2100622, entitled "Low Side Driver for Laser Diode," and filed on Jan. 22, 2021, which application is hereby incorporated herein by reference.

TECHNICAL FIELD

The present disclosure relates generally to an electronic system and method, and, in particular embodiments, to a low side driver for a laser diode.

BACKGROUND

Laser diodes are configured to emit light radiation when an electric current passes through them. Laser diodes can be used as an emitter in time-of-flight sensors. The radiation that can be emitted by the laser diode can be reflected by an object then sensed by a receiver of the time-of-flight sensor.

In order to be able to illuminate an entire room through a diffractive optical element, it may be necessary for the laser diode to emit radiation with high power. It is therefore important to maintain at least substantially constant a current sinked by the low side driver because the optical power emitted by a laser diode is directly proportional to the current passing therethrough.

SUMMARY

The known low side drivers for laser diodes do not allow to guarantee the value of the currents sinked by these low side drivers when the cathode potential of the laser diode is low.

This is because when the output voltage of a known low side driver is below a certain threshold, the sink current drops. It is therefore advisable to operate the low side drivers with an output voltage above this threshold in order to guarantee a precise sink current. In particular, in order to guarantee a sink current by a precise low side driver through a diode, it is possible to increase the value of the anode potential of the diode to increase at the same time the cathode potential thereof.

However, such a solution requires dissipating a larger amount of power. The laser diode driver can then heat up and the autonomy of the battery-powered time-of-flight sensor may be reduced.

In order to avoid this disadvantage, a solution should guarantee a precise sink current for low cathode potentials of the laser diode and thus reduce the power consumed by the laser diode driver.

There is therefore a need to provide a low side driver integrated circuit for a laser diode allowing to drive a laser diode with a minimum cathode voltage in order to reduce the power consumed by the laser diode driver.

Embodiments relate to laser diodes, and more particularly to low side driver integrated circuits for a laser diode.

In one aspect, provision is made of a low side driver integrated circuit for a laser diode comprising:
a reference transistor,
an output transistor having a drain configured to be connected to a laser diode, and a gate connected to a gate of the reference transistor,
a switching transistor having a gate configured to receive a pulsed signal, a drain connected to a source of the output transistor, and a source connected to a cold point, for example a ground,
a transistor, called matching transistor, having a drain connected to a source of the reference transistor and a source connected to the cold point, this matching transistor being configured to obtain on its drain a source potential of the reference transistor equal to a source potential of the output transistor,
a first servo-control circuit configured to apply a drain potential of the output transistor to a drain of the reference transistor, and
a second servo-control circuit configured to apply a static reference voltage to the source of the reference transistor.

Such a low side driver allows to modulate the current passing through the laser diode.

Such a low side driver allows to obtain a drain-source voltage of the output transistor equal to a drain-source voltage of the reference transistor, that is to say to the cathode voltage minus the static reference voltage.

Furthermore, such a low side driver allows to obtain a gate-source voltage of the output transistor equal to a gate-source voltage of the reference transistor.

Thus, some embodiments allow to guarantee that the current circulating in the output transistor is equivalent to the current circulating through the reference transistor, at the ratio close to the sizes of the output and switching transistors and the reference and matching transistors, respectively.

Thus, some embodiments to reduce a minimum threshold value of the voltage at the drain of the output transistor for which the sink current can drop thanks to the second servo-control means adjusting the gate-source voltage of the reference transistor.

Thus, some embodiments to obtain a constant sink current by the output transistor when the laser diode is power supplied. Such a low side driver circuit thus allows to reduce the power consumed by the laser diode driver.

The current sinked through the laser diode is therefore precise at least until the servo-control circuit is saturated.

Preferably, the matching transistor has dimensions adapted so that the ratio between dimensions of the matching transistor and dimensions of the switching transistor is the same as the ratio between dimensions of the reference transistor and dimensions of the output transistor.

In an advantageous embodiment, the first servo-control circuit comprises a first voltage follower configured to apply a drain potential of the output transistor to the drain of the reference transistor.

In an advantageous embodiment, the first voltage follower comprises:
a transistor having a drain connected to a voltage source and a source connected to the drain of the reference transistor, and
a first operational amplifier having a first input connected to the drain of the output transistor (potentially via a sample-hold circuit) and a second input connected to the drain of the reference transistor and an output connected to a gate of the transistor of this first voltage follower.

In an advantageous embodiment, the first servo-control circuit further comprise a sample-hold circuit having an input connected to the drain of the output transistor and an output connected to the first input of the first operational amplifier.

The sample-hold circuit allows to measure the drain potential of the output transistor only when it is powered up and to save the value of the potential measured at the input of the amplifier when the output transistor is shut down. This potential is applied to the drain of the reference transistor via the first voltage follower.

In an advantageous embodiment, the sample-hold circuit comprises:
- a switch having a first terminal connected to the input of the sample-hold circuit, the switch being configured to be controlled according to the pulsed signal,
- a resistor having a first terminal connected to a second terminal of the switch, and a second terminal connected to the output of the sample-hold circuit, and
- a capacitor having a first terminal connected to the cold point and a second terminal connected to the output of the sample-hold circuit.

In an advantageous embodiment, the integrated circuit comprises a reference current source, in particular a current reference device, and a transistor having a gate connected to a gate of the matching transistor and biased at the same potential as the gate of the switching transistor when the latter is turned on, a drain connected to the current source and a source connected to the cold point, the static reference voltage being the voltage at the drain of the transistor connected to the current source. Advantageously, the gate of the transistor connected to the current source is biased so that these two transistors are turned on. Preferably, the transistor connected to the current source is identical to the matching transistor, or has dimensions allowing to obtain a ratio between the dimensions of this transistor connected to the current source and the dimensions of the matching transistor equal to a ratio between the currents circulating in this transistor connected to the current source and in the matching transistor.

In an advantageous embodiment, the second servo-control circuit comprise a second voltage follower configured to bias the gate of the reference transistor and the gate of the output transistor, the second voltage follower being configured to apply the static reference voltage to the source potential of the reference transistor.

In an advantageous embodiment, the second voltage follower comprises a second operational amplifier having:
- a first input connected to the current source and to the drain of the transistor connected to the current source,
- a second input connected to the source of the reference transistor and to the drain of the matching transistor, and
- an output connected to the gate of the reference transistor and to the gate of the output transistor.

In an advantageous embodiment, the second voltage follower further comprises:
- a capacitor having a first terminal connected to the cold point and a second terminal connected to the second input of the second operational amplifier, and
- a resistor having a first terminal connected to the second terminal of the capacitor, and a second terminal connected to the source of the reference transistor and to the drain of the matching transistor.

In an advantageous embodiment, the integrated circuit further comprises a decoupling capacitor having a first terminal connected to the cold point and a second terminal connected to the gate of the reference transistor and to the gate of the output transistor.

In an advantageous embodiment, the reference transistor, the output transistor, the switching transistor, the matching transistor, the transistor connected to the current source and the transistor of the first voltage follower are transistors of the MOSFET type.

According to another aspect, provision is made of a time-of-flight sensor comprising a low side driver integrated circuit as described above, and a laser diode connected to this integrated circuit.

According to another aspect, provision is made of a method for controlling a laser diode, comprising:
- connecting to the laser diode, a drain of an output transistor of a low side driver integrated circuit,
the integrated circuit further including:
- a reference transistor having a gate connected to the gate of the output transistor,
- a switching transistor having a drain connected to a source of the output transistor, and a source connected to a cold point, for example a ground,
- a transistor, called matching transistor, having a drain connected to a source of the reference transistor and a source connected to the cold point,
- first servo-control means, and
- a second servo-control circuit,
the method further comprising:
- delivering a pulsed signal on the gate of the switching transistor, and method wherein in the presence of this pulsed signal:
- the matching transistor delivers on its drain a source potential of the reference transistor equal to a source potential of the output transistor,
- the first servo-control means apply a drain potential of the output transistor to a drain of the reference transistor,
- the second servo-control circuit applies a static reference voltage to the source of the reference transistor, and
- the drain of the output transistor sinks a current from the laser diode for the emission of light radiation by this laser diode.

BRIEF DESCRIPTION OF THE DRAWINGS

Other advantages and features of the invention will become apparent upon examining the detailed description of the embodiment, which is in no way limiting, and the appended drawing wherein:

FIG. 1 schematically illustrates an embodiment of the invention.

DETAILED DESCRIPTION OF ILLUSTRATIVE EMBODIMENTS

FIG. 1 illustrates a low side driver integrated circuit (IC) CI. The integrated circuit CI comprises an output OUT configured to be connected to a laser diode DL.

The integrated circuit CI comprises an output transistor M49 and a reference transistor M48.

The output transistor M49 and the reference transistor M48 may both be MOSFET (acronym for "Metal Oxide Semiconductor Field Effect Transistor") transistors.

The output transistor M49 has a source SM49, a drain DM49 and a gate GM49. The reference transistor M48 has a source SM48, a drain DM48 and a gate GM48. The drain DM49 of output transistor M49 is connected to output OUT of the integrated circuit. The gate GM49 of the output transistor M49 is connected to the gate GM48 of the reference transistor M48.

In some embodiments, the output transistor M49 advantageously has larger dimensions than the reference transistor M48.

The integrated circuit CI also comprises a decoupling capacitor C15 connected to the gate GM48 of the reference transistor M48 and to the gate GM49 of the output transistor M49. More particularly, the decoupling capacitor C15 has a first terminal connected to the gate GM49 of the output transistor M49 and to the gate GM48 of the reference transistor M48, and a second terminal connected to a ground GND.

The integrated circuit CI further comprises a switching transistor M44. Preferably, the switching transistor M44 is also a MOSFET transistor.

The switching transistor M44 has a source SM44, a drain DM44 and a gate GM44. The source SM44 of the switching transistor M44 is connected to the ground GND. The drain DM44 of the switching transistor M44 is connected to the source SM49 of the output transistor M49.

The integrated circuit CI further comprises a buffer BUF having an input configured to receive a pulsed signal SPUL and an output connected to the gate GM44 of the switching transistor M44.

The integrated circuit CI further comprises a matching transistor M45. Preferably, the matching transistor M45 is also a MOSFET transistor.

The matching transistor M45 has a source SM45, a drain DM45 and a gate GM45. The source SM45 of the matching transistor M45 is connected to the ground GND. The drain DM45 of the matching transistor M45 is connected to the source SM48 of the reference transistor M48.

The dimensions of the matching transistor M45 are adapted such that the ratio between the dimensions of the matching transistor M45 and those of the switching transistor M44 is the same as the ratio between the dimensions of the reference transistor M48 and those of the output transistor M49.

Moreover, the integrated circuit CI comprises a first servo-control circuit MA1 configured to apply a drain potential DM49 of the output transistor M49 to a drain DM48 of the reference transistor M48.

The first servo-control circuit MA1 comprises a sample-hold circuit CEB having an input CEBIN connected to the drain of the output transistor M49. In particular, the sample-hold circuit CEB comprises a switch INT controlled by the pulsed signal SPUL.

The switch INT has a first terminal connected to the input of the sample-hold circuit CEBIN. The switch INT has a second terminal connected to a first terminal of a resistor C14 of the sample-hold circuit. The resistor C14 has a second terminal connected to an output CEBOUT of the sample-hold circuit CEB.

The sample-hold circuit CEB further comprises a capacitor C13 having a first terminal connected to the ground GND and a second terminal connected to the output CEBOUT of the sample-hold circuit CEB and to the second terminal of the resistor C14.

The first servo-control circuit MA1 further comprises a first voltage follower ST1.

The first voltage follower ST1 also comprises a first operational amplifier AOP1 having a first input AIN11 connected to the output CEBOUT of the sample-hold circuit CEB and a second input AIN12 connected to the drain DM48 of the reference transistor M48. Preferably, the first input AIN11 is a non-inverting input and the second input AIN12 is an inverting input.

The operational amplifier AOP1 comprises an output AOUT1.

The first voltage follower ST1 further comprises a transistor M51. Preferably, the transistor M51 is a MOSFET transistor.

The transistor M51 comprises a source SM51, a drain DM51 and a gate GM51. The source SM51 of the transistor M51 is connected to the drain DM48 of the reference transistor M48 and to the second input AIN12 of the operational amplifier AOP1. The drain DM51 of the transistor M51 is connected to a voltage source VAL.

The voltage source VAL can be greater than a supply voltage VDD by being generated by a voltage step-up circuit, for example a charge pump converter.

The gate GM51 of the transistor M51 is connected to the output AOUT1 of the operational amplifier AOP1.

The integrated circuit CI further comprises a current reference device SC receiving a supply voltage VDD.

The integrated circuit CI further comprises a transistor M43. Preferably, the transistor M43 is also a MOSFET transistor.

The transistor M43 is identical to the transistor M45 or else of dimensions respecting the same ratio between the dimensions of the transistors M43 and M45 and the currents circulating through the latter. The transistor M43 has a source SM43, a drain DM43 and a gate GM43. The source SM43 of transistor M43 is connected to the ground GND. The drain DM43 of the transistor M43 is connected to the current reference device SC. The gate GM43 of the transistor M43 is connected to the gate GM45 of the matching transistor M45 and is biased such that both transistors are turned on. The drain potential of the transistor M43 defines a static reference voltage VREF.

The integrated circuit further comprises a second servo-control circuit MA2 configured to apply the static reference voltage VREF to the source SM48 of the reference transistor M48 as well as to the drain of the matching transistor DM45.

The second servo-control circuit MA2 comprise a second voltage follower ST2.

The second voltage follower ST2 comprises a second operational amplifier AOP2.

The operational amplifier AOP2 has a first input AIN21 connected to the current reference device SC and to the drain DM43 of the transistor M43.

The operational amplifier AOP2 also has a second input AIN22 connected to the source SM48 of the reference transistor M48 and to the drain DM45 of the matching transistor M45 via a circuit RC. Preferably, the first input AIN21 of the operational amplifier AOP2 is a non-inverting input and the second input AIN22 of the amplifier is an inverting input.

The circuit RC comprises a resistor Rg having a first terminal connected to the second input AIN22 of the operational amplifier AOP2 and a second terminal connected to the source SM48 of the reference transistor M48 and to the drain DM45 of the matching transistor M45. The circuit RC also comprises a capacitor C1B having a first terminal connected to the ground GND and a second terminal connected to the first terminal of the resistor Rg and to the second input AIN22 of the operational amplifier AOP2.

The operational amplifier AOP2 further comprises an output AOUT2 connected to the gate GM48 of the reference transistor M48 and to the gate GM49 of the output transistor M49.

Thus, the gate GM48 of the reference transistor M48 is biased by the operational amplifier AOP2.

The second operational amplifier AOP2 allows to servo-control the source potential SM48 of the transistor M48, and therefore the drain potential of the transistor M45, to the drain potential of the transistor M43, that is to say to the static reference voltage VREF.

In this way, the drain current of the matching transistor M45 is equal to the drain current of the transistor M43 (or else their ratio is the same as that of the dimensions of the transistors M43 and M45), because these two transistors M43 and M45 are identical (or of dimensions respecting the same ratio) and have the same drain-source voltage and the same gate-source voltage.

Thus, the drain current of the reference transistor M48 is also equal to the drain current of the matching transistor M45, and therefore equal to the drain current of the transistor M43, or respects a ratio equal to the ratio between the dimensions of the transistors M43 and M45.

Moreover, the gate GM48 of the reference transistor M48 being connected to the gate GM49 of the output transistor M49, the gate potential of the reference transistor M49 is equal to the gate potential of the reference transistor M48.

Furthermore, due to the equality between the dimension ratio between the reference transistor M48 and the output transistor M49 and the dimension ratio between the matching transistor M45 and the switching transistor M44, as well as the fact that the gates of the reference transistor M48 and of the output transistor M49 are at the same potential, and the fact that the servo-control circuit MA1 guarantees that the drain potential of the reference transistor M48 is equal to the drain potential of the output transistor M49, and the fact that the transistor M44 receives on its gate a potential equal to the gate potential of the transistors M43 and M45 when this transistor M44 is turned on, the source potential of the output transistor M49 is equal to the source potential of the reference transistor M48.

Moreover, the sample-hold circuit CEB allows to measure the drain potential of the transistor M49. This potential is applied to the drain of the reference transistor M48 via the operational amplifier AOP1 and the transistor M51 of the first voltage follower ST1. Thus, the drain potential of the output transistor M49 is equal to the drain potential of the reference transistor M48.

The drain-source voltage of the output transistor M49 is therefore equal to the drain-source voltage of the reference transistor M48. Likewise, the gate-source voltage of the output transistor M49 is equal to the gate-source voltage of the reference transistor M48. Also, the gate-source and drain-source voltages of the transistors M44 and M45 are equal.

This allows to obtain a drain current of the output transistor M49 corresponding to the reference current circulating in the reference transistor M48 and amplified by the ratio between the dimensions between the transistors M48 and M49 and the transistors M45 and M44.

In this way, the low side driver integrated circuit allows precise power supply of a laser diode to be obtained. Such a low side driver circuit thus allows to reduce the power consumed by the laser diode driver.

The low side driver integrated circuit can be used in a time-of-flight sensor comprising a laser diode DL having a cathode connected to the drain of the output transistor of the low side driver integrated circuit. The laser diode DL then has an anode receiving a voltage VAN.

In a method for controlling an emission of light radiation from a laser diode DL according to an implementation of the invention, the low side driver integrated circuit described above in relation to FIG. 1 is used.

In such a method, the emission of light radiation is controlled from the pulsed signal SPUL delivered to the gate GM44 of the switching transistor M44 via the buffer BUF.

When the pulsed signal SPUL is in a high state, the switching transistor M44 turns on.

The laser diode is then traversed by an electric current. This allows the laser diode DL to emit light radiation.

This electric current is sinked by the low side driver integrated circuit.

As indicated above, this sink current is precise and therefore allows precise emission of light radiation by the laser diode DL.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A low side driver integrated circuit for a laser diode, the low side driver integrated circuit comprising:
    a reference transistor having first and second conduction terminals;
    an output transistor having a first conduction terminal configured to be coupled to the laser diode, and a control terminal coupled to a control terminal of the reference transistor;
    a switching transistor having a control terminal configured to receive a pulsed signal, a first conduction terminal coupled to a second conduction terminal of the output transistor, and a second conduction terminal coupled to a reference node;
    a matching transistor having a first conduction terminal coupled to the second conduction terminal of the reference transistor and a second conduction terminal coupled to the reference node, the matching transistor being configured to obtain on the first conduction terminal of the matching transistor a voltage of the second conduction terminal of the reference transistor, the voltage of the second conduction terminal of the reference transistor being equal to a voltage of the second conduction terminal of the output transistor;
    a first servo-control circuit configured to apply a voltage of the first conduction terminal of the output transistor to the first conduction terminal of the reference transistor; and
    a second servo-control circuit configured to apply a static reference voltage to the second conduction terminal of the reference transistor.

2. The low side driver integrated circuit of claim 1, wherein the matching transistor has dimensions adapted so that a ratio between dimensions of the matching transistor and dimensions of the switching transistor is the same as the ratio between dimensions of the reference transistor and dimensions of the output transistor.

3. The low side driver integrated circuit of claim 1, wherein the first servo-control circuit comprises a voltage follower configured to apply the voltage of the first conduction terminal of the output transistor to the first conduction terminal of the reference transistor.

4. The low side driver integrated circuit of claim 3, wherein the voltage follower comprises:
    a first transistor having a first conduction terminal coupled to a supply terminal configured to receive a supply voltage, and a second conduction terminal coupled to the first conduction terminal of the reference transistor; and a first operational amplifier having a first input coupled to the first conduction terminal of the output transistor, a second input coupled to the first conduction terminal of the reference transistor, and an output coupled to a control terminal of the first transistor.

5. The low side driver integrated circuit of claim 4, wherein the first servo-control circuit further comprises a sample-hold circuit having an input coupled to the first conduction terminal of the output transistor and an output coupled to the first input of the first operational amplifier.

6. The low side driver integrated circuit of claim 5, wherein the sample-hold circuit comprises:
    a switch having a first terminal coupled to the input of the sample-hold circuit, the switch being configured to be controlled according to the pulsed signal;
    a resistor having a first terminal coupled to a second terminal of the switch, and a second terminal coupled to the output of the sample-hold circuit; and
    a capacitor having a first terminal coupled to the reference node and a second terminal coupled to the output of the sample-hold circuit.

7. The low side driver integrated circuit of claim 1, further comprising:
    a reference current source; and
    a first transistor having a control terminal coupled to a control terminal of the matching transistor and configured to be biased at a same voltage as the control terminal of the switching transistor when the switching transistor is turned on, a first conduction terminal coupled to the reference current source, and a second conduction terminal coupled to the reference node, the static reference voltage being the voltage at the first conduction terminal of the first transistor, wherein the control terminal of the first transistor is configured to be biased so that the first transistor and the matching transistor are turned on, and wherein the first transistor is identical to the matching transistor or has dimensions allowing to obtain a ratio between the dimensions of the first transistor and the dimensions of the matching transistor equal to a ratio between the currents circulating in the first transistor and in the matching transistor.

8. The low side driver integrated circuit of claim 1, wherein the second servo-control circuit comprises a voltage follower configured to bias the control terminal of the reference transistor and the control terminal of the output transistor, the voltage follower being configured to apply the static reference voltage to the second conduction terminal of the reference transistor.

9. The low side driver integrated circuit of claim 8, wherein the voltage follower comprises a first operational amplifier having:
    a first input coupled to a reference current source and to a first conduction terminal of a first transistor;
    a second input coupled to the second conduction terminal of the reference transistor and to the first conduction terminal of the matching transistor; and
    an output coupled to the control terminal of the reference transistor and to the control terminal of the output transistor.

10. The low side driver integrated circuit of claim 9, wherein the voltage follower further comprises:
    a capacitor having a first terminal coupled to the reference node and a second terminal coupled to the second input of the first operational amplifier; and
    a resistor having a first terminal coupled to the second terminal of the capacitor, and a second terminal coupled to the second conduction terminal of the reference transistor and to the first conduction terminal of the matching transistor.

11. The low side driver integrated circuit of claim 1, further comprising a decoupling capacitor having a first terminal coupled to the reference node and a second terminal coupled to the control terminal of the reference transistor and to the control terminal of the output transistor.

12. The low side driver integrated circuit of claim 1, wherein the reference transistor, the output transistor, the switching transistor, and the matching transistor, are of a metal-oxide semiconductor field-effect transistor (MOSFET) type.

13. The low side driver integrated circuit of claim 12, wherein:
    the first and second conduction terminals of the reference transistor are drain and source terminals, respectively;
    the first and second conduction terminals of the output transistor are drain and source terminals, respectively; and
    the first and second conduction terminals of the switching transistor are drain and source terminals, respectively.

14. A time-of-flight sensor comprising:
    a laser diode; and
    an integrated circuit comprising:
        a reference transistor having first and second conduction terminals,
        an output transistor having a first conduction terminal coupled to the laser diode, and a control terminal coupled to a control terminal of the reference transistor,
        a switching transistor having a control terminal configured to receive a pulsed signal, a first conduction terminal coupled to a second conduction terminal of the output transistor, and a second conduction terminal coupled to a reference node,
        a matching transistor having a first conduction terminal coupled to the second conduction terminal of the reference transistor and a second conduction terminal coupled to the reference node, the matching transistor being configured to obtain on the first conduction terminal of the matching transistor a voltage of the second conduction terminal of the reference transistor, the voltage of the second conduction terminal of the reference transistor being equal to a voltage of the second conduction terminal of the output transistor,
        a first servo-control circuit configured to apply a voltage of the first conduction terminal of the output transistor to the first conduction terminal of the reference transistor, and
        a second servo-control circuit configured to apply a static reference voltage to the second conduction terminal of the reference transistor.

15. The time-of-flight sensor of claim 14, wherein the matching transistor has dimensions adapted so that a ratio between dimensions of the matching transistor and dimensions of the switching transistor is the same as the ratio between dimensions of the reference transistor and dimensions of the output transistor.

16. The time-of-flight sensor of claim 14, wherein the first servo-control circuit comprises:
    a first voltage follower configured to apply the voltage of the first conduction terminal of the output transistor to the first conduction terminal of the reference transistor, the first voltage follower comprising:

a first transistor having a first conduction terminal coupled to a supply terminal configured to receive a supply voltage, and a second conduction terminal coupled to the first conduction terminal of the reference transistor, and a first operational amplifier having a first input coupled to the first conduction terminal of the output transistor, a second input coupled to the first conduction terminal of the reference transistor, and an output coupled to a control terminal of the first transistor, and a sample-hold circuit having an input coupled to the first conduction terminal of the output transistor and an output coupled to the first input of the first operational amplifier, the sample-hold circuit comprising:

a switch having a first terminal coupled to the input of the sample-hold circuit, the switch being configured to be controlled according to the pulsed signal, a resistor having a first terminal coupled to a second terminal of the switch, and a second terminal coupled to the output of the sample-hold circuit, and a capacitor having a first terminal coupled to the reference node and a second terminal coupled to the output of the sample-hold circuit.

17. The time-of-flight sensor of claim 14, wherein the integrated circuit further comprises:

a reference current source; and a first transistor having a control terminal coupled to a control terminal of the matching transistor and configured to be biased at a same voltage as the control terminal of the switching transistor when the switching transistor is turned on, a first conduction terminal coupled to the reference current source, and a second conduction terminal coupled to the reference node, the static reference voltage being the voltage at the first conduction terminal of the first transistor, wherein the control terminal of the first transistor is configured to be biased so that the first transistor and the matching transistor are turned on, and wherein the first transistor is identical to the matching transistor or has dimensions allowing to obtain a ratio between the dimensions of the first transistor and the dimensions of the matching transistor equal to a ratio between the currents circulating in the first transistor and in the matching transistor, wherein the second servo-control circuit comprises a second voltage follower comprising an operational amplifier having:

a first input coupled to the reference current source and to the first conduction terminal of the first transistor, a second input coupled to the second conduction terminal of the reference transistor and to the first conduction terminal of the matching transistor, and an output coupled to the control terminal of the reference transistor and to the control terminal of the output transistor.

18. A method for controlling a laser diode, the method comprising:

delivering a pulsed signal on a gate of a switching transistor, the switching transistor having a drain coupled to a source of an output transistor, and a source coupled to a reference node, the output transistor having a drain coupled to the laser diode; and when in the presence of the pulsed signal:

delivering, with a drain of a matching transistor, a source voltage of a reference transistor equal to a source voltage of the output transistor, the reference transistor having a gate coupled to a gate of the output transistor, the matching transistor having a drain coupled to a source of the reference transistor and a source coupled to the reference node, applying, with a first servo-control circuit, a drain voltage of the output transistor to a drain of the reference transistor, applying, with a second servo-control circuit, a static reference voltage to the source of the reference transistor, and sinking, with the drain of the output transistor, a current from the laser diode to cause emission of light radiation by the laser diode.

19. The method of claim 18, wherein the matching transistor has dimensions adapted so that a ratio between dimensions of the matching transistor and dimensions of the switching transistor is the same as the ratio between dimensions of the reference transistor and dimensions of the output transistor.

20. The method of claim 18, wherein the gate of the reference transistor is coupled to a decoupling capacitor, wherein the first servo-control circuit comprises:

a first voltage follower comprising:

a first transistor having a drain for receiving a supply voltage, and a second conduction terminal coupled to the drain of the reference transistor, and a first operational amplifier having a first input coupled to the drain of the output transistor, a second input coupled to the drain of the reference transistor, and an output coupled to a gate of the first transistor, and a sample-hold circuit having an input coupled to the drain of the output transistor and an output coupled to the first input of the first operational amplifier, the sample-hold circuit comprising:

a switch having a first terminal coupled to the input of the sample-hold circuit, the switch being controlled according to the pulsed signal, a resistor having a first terminal coupled to a second terminal of the switch, and a second terminal coupled to the output of the sample-hold circuit, and a capacitor having a first terminal coupled to the reference node and a second terminal coupled to the output of the sample-hold circuit, and wherein the second servo-control circuit comprises a second voltage follower for biasing the gate of the reference transistor and the gate of the output transistor, wherein applying the static reference voltage to the source of the reference transistor comprises applying the static reference voltage to the source of the reference transistor with the second voltage follower.

* * * * *